United States Patent [19]

Haruta et al.

[11] 4,152,477
[45] May 1, 1979

[54] PRINTED CIRCUIT BOARD AND METHOD FOR MAKING THE SAME

[75] Inventors: Youichi Haruta, Hirakata; Teruyo Noguchi, Moriguchi; Hiroshi Yasuda, Neyagawa; Hiroshi Sakata, Otsu, all of Japan

[73] Assignee: Matsushita Electric Industrial Co., Ltd., Osaka, Japan

[21] Appl. No.: 759,806

[22] Filed: Jan. 17, 1977

[30] Foreign Application Priority Data

Jan. 20, 1976 [JP] Japan .................................... 51-5628

[51] Int. Cl.² ........................... C23C 3/02; H05K 3/00
[52] U.S. Cl. .................................... 428/209; 156/668; 174/68.5; 427/98; 427/57; 427/245; 427/246; 427/305; 427/306; 427/307; 427/373; 428/327; 428/601; 428/901
[58] Field of Search ....................... 427/97, 98, 54, 57, 427/245, 246, 222, 305, 306, 307, 373; 156/668; 204/38 B; 260/2.5 B, 2.5 H, 846; 428/901, 209, 327; 174/68.5

[56] References Cited

U.S. PATENT DOCUMENTS

| | | | |
|---|---|---|---|
| 3,625,758 | 12/1971 | Stahl et al. | 427/98 |
| 3,737,339 | 6/1973 | Alsberg | 428/901 |
| 3,959,547 | 5/1976 | Polichette et al. | 427/306 |
| 4,001,466 | 1/1977 | Shawl et al. | 427/98 |
| 4,005,238 | 1/1977 | Gaehde et al. | 427/373 |
| 4,551,362 | 12/1970 | Decker | 260/846 |

Primary Examiner—John D. Smith
Attorney, Agent, or Firm—Spencer & Kaye

[57] ABSTRACT

A printed circuit board made by providing on an insulating substrate an adhesive coating comprising a butadiene-based rubber and a phenolic resin finely dispersed therein, etching the surface layer of said coating with an oxidizing agent to expose the microcapsules having phenolic resin shells, which have been formed during the setting of said adhesive coating, and forming a chemically deposited metal layer on said adhesive coating.

4 Claims, 6 Drawing Figures

PRINTED CIRCUIT BOARD AND METHOD FOR MAKING THE SAME

BACKGROUND OF THE INVENTION

This invention relates to a novel bonding mechanism to ensure tight adhesion between a chemically deposited metal layer and an insulating substrate and provides, in particular, a printed circuit board which is excellent in heat resistance. It also relates to a method for making the same.

A variety of methods have heretofore been developed for the chemical metal plating over insulating substrates. For instance, there has been known a method for plating a metal over a plastic material, which comprises etching a shaped article of an acrylonitrile-butadiene-styrene copolymer with a chromic acid-sulfuric acid solution to rupture the double bonds of the butadiene, thus forming polar groups such as carbonyl and carboxyl and, at the same time, fine pores as a result of removal of butadiene by dissolution, then subjecting the surface of the thus treated article to an sensitizing treatment using stannous chloride and palladium chloride which have a catalytic effect on chemical plating, and thereafter chemically depositing a metal layer such as nickel or copper on the activated surface of the article. This method aims at taking advantages of both the chemical bonding due to the polar groups and the mechanical bonding due to the fine pores in establishing tight adhesion between the metal and the plastic material.

In the field of electronic equipments, on the other hand, so-called printed circuit boards made by forming printed circuits on insulating substrates made of phenolic resins, epoxy resins, and polyester resins as major materials have played an important role in miniaturization and weight reduction of these electronic equipments.

One of the known effective means for making such printed circuit boards is the additive method which employs a technique for plating a metal on plastic materials and comprises the following sequence of steps: as shown in FIG. 1, an insulating substrate 1 is coated on the surface with a thermosetting adhesive 2, such as a nitrile-rubber-modified phenolic resin; the adhesive 2 is cured partially or entirely; the surface of the adhesive is etched with a chromic acid-sulfuric acid solution to provide finely distributed minute pores or depressions 3; the adhesive layer is then treated with an aqueous solution containing palladium chloride to sensitize the adhesive layer on the surface; the thus treated adhesive surface is subjected to chemical plating to deposit a metal layer 4; a negative-image resist pattern is applied onto the metal layer 4; electroplating is applied to grow a metal layer on the said chemically deposited metal layer 4 exposed in prescribed pattern; the resist layer is removed; the chemically deposited metal in the undesired areas is removed by etching; and, if necessary, the adhesive layer is ultimately cured to bond the metal layer firmly to the substrate. In the above method, firm bonding of the metal layer 4 to the insulating substrate 1 is obtained, similarly to the case of the metal plating on plastic materials, by surface etching of an adhesive layer, which gives rise to chemical adhesion caused by polar groups such as carbonyl and carboxyl which are formed and also to mechanical adhesion owing to the anchor effect which is attributable to the minute pores or depressions 3.

However, when such a method is employed in making a printed circuit board, the chromic acid-sulfuric acid solution used to form minute pores 3 by etching tends to remain in the minute pores. In some cases, the minute pores contain also some amount of undesirable chemicals which are used in the steps subsequent to the etching. Consequently, when such a printed circuit board is included in an electronic equipment, there is a danger of electrolytic corrosion caused by the electric charge. The printed circuit board made by the above-noted method has also another disadvantage of inferior soldering resistance, because such a printed circuit board is liable to absorb water during electroless or electrolytic plating owing to the presence of minute pores 3 on the surface of adhesive layer 2 and the absorbed water is released as a vapor on sudden heating during soldering work to mount various components to the printed circuit board, thus resulting in blistering due to the released vapor between the insulating substrate 1 and the metal layer 4.

SUMMARY OF THE INVENTION

An object of this invention is to provide a printed circuit board having a high bond strength (peel strength) between the insulating substrate and the metal layer and being excellent in soldering resistance, electrolytic corrosion resistance, and reliability of through holes.

Another object of this invention is to provide a commercially applicable and profitable method for easily making this printed circuit board.

DETAILED DESCRIPTION OF THE INVENTION

Figure 1:
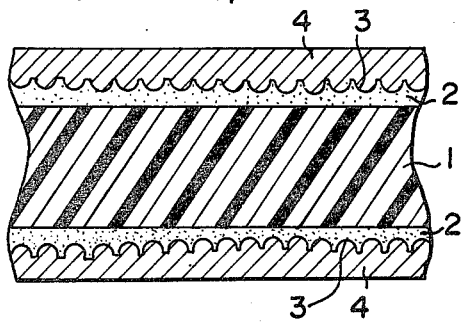
FIG. 1 is a cross-sectional view of the printed circuit board obtained by a conventional method.
Figure 2:
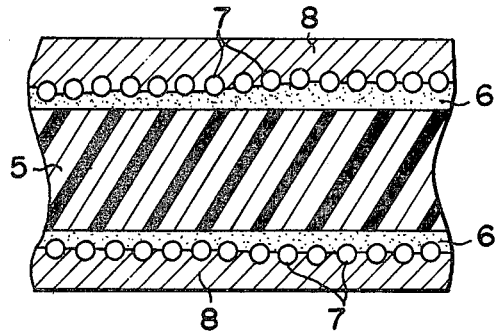
FIG. 2 is a cross-sectional view of the printed circuit board in one of the embodiments of this invention.

This invention has been accomplished as the result of attempts made in order to improve the aforesaid disadvantages of the conventional method. It has been found that a printed circuit board having a high bond strength (peel strength) between the insulating substrate 5 and the metal layer 8 (FIG. 2) and being excellent in soldering resistance, electrolytic corrosion resistance, and plated-through-hole reliability may be obtained by applying to the surface of the insulating substrate 5 an adhesive composition 6 comprising a butadiene-based rubber and a phenolic resin dispersed therein, then curing the adhesive composition to form an adhesive layer containing microcapsules having shells of said phenolic resin, etching the butadiene rubber enclosing said microcapsules with an oxidizing agent thereby to expose said microcapsule shells 7 of the phenolic resin on the surface of said adhesive layer, subjecting the surface of said adhesive layer to a sensitizing treatment thereby to allow the surface to absorb a substance catalytic to chemical plating, and applying chemical or electrolytic plating to said surface thereby to form a metal layer 8.

In preferred embodiments of this invention, an insulating substrate made of a phenolic resin or an epoxy resin as a major component or an insulating ceramic substrate 5 is coated by dipping, roll coating, flow coating, (curtain coating), or laminating with an adhesive composition comprising a butadiene rubber and a phenolic resin dispersed therein by suitable means, thereby to form an adhesive layer 6 which is then cured under suitable conditions to polymerize the phenolic resin, whereby spherical microcapsules 7 each having a shell of phenolic resin enclosing the butadiene rubber are formed. On an etching treatment of the adhesive layer 6 with an oxidizing agent, the butadiene rubber surrounding the microcapsules 7 is preferentially etched and the surface of the adhesive layer 6 is covered with wartlike protrusions of exposed spherical microcapsules having phenolic resin shells. Since these spherical microcapsules are fine particles of a diameter of about 0.1 to about $2\mu$, the surface area of the adhesive layer 6 is markedly increased, thus giving rise to a strong bonding between the metal layer 8 to be subsequently deposited chemically or electrolytically thereon and the insulating substrate 5.

According to this invention, since the metal layer 8 and the insulating substrate 5 are firmly bonded together through the mechanical adhesion associated with protruded microcapsules, there occurs substantially no retention of undesirable residual chemicals used in oxidizing, activating, and plating treatments nor hygroscopicity. Due to the above-noted advantages and the heat resistant phenolic resin covering the adhesive layer 6, there is provided a printed circuit board which is not susceptible to electrolytic corrosion and having a high soldering resistance.

The materials for the insulating substrates usable in this invention include inorganic and organic substances such as glass, porcelain, earthenware, resin, paper, cloth, and the like. Insulating substrates of either thermoplastic or thermosetting resins as major components may be used. Other usable substrates are those made of conducting materials such as aluminum and steel which have been undergone an insulating treatment on the surface, such as, for example, fluidized bed coating, electrostatic coating, or the like.

The adhesive composition for use in this invention is prepared by thoroughly masticating 20 to 200 parts by weight of an acrylonitrile-rich elastomeric acrylonitrile-butadiene copolymer on a hot roll-mill, dissolving the masticated copolymer in a ketonic solvent such as methyl ethyl ketone, acetone, or methyl isobutyl ketone, and adding to the resulting solution with vigorous stirring a solution of 50 to 100 parts by weight of a a thermosettable resol type phenolic resin in a solvent such as an alcohol or a ketone, thus yielding a fine dispersion of the phenolic resin. Improved dispersion of the phenolic resin in the adhesive composition may be obtained by using an alcohol such as methanol, ethanol, butyl alcohol, or isopropyl alcohol as the solvent for phenolic resin.

In curing the adhesive coating 6, rapid heating and succeeding rapid cooling promote the formation of phenolic resin microcapsules. Joint use of ultrasonic waves may further promote the process. Desirable microcapsules 7 may be obtained with ultrasonic waves at 16 kHz to 1 MHz under an atmosphere at 120° to 180° C.

Heating under exposure to ulraviolet rays also promotes the formation of phenolic resin microcapsules.

Etching of the adhesive layer 6 is carried out by use of an aqueous solution of chromic acid-sulfuric acid or an aqueous acidic or alkaline solution of potassium permanganate. By etching, the butadiene rubber is removed by dissolution and phenolic resin microcapsules are exposed. An aqueous solution of potassium permanganate is more suitable, because an aqueous solution of chromic acid-sulfuric acid may sometimes destroy the phenolic resin capsules 7.

Firm bonding of the metal layer 8 to the insulating substrate 5 has been generally considered to be due to both the mechanical anchor effect and the chemical effect of polar groups. Nevertheless, the method of this invention is characterized by formation of a firm bond by mechanical penetration of protruded microcapsules 7 into the metal layer 8. According to the results of experiments conducted by the present inventors, it was found that the adhesive layer 6 in the present invention will not be improved in bond strength by the increase in number of polar groups which are formed during the etching treatment. On being etched, the adhesive layer 6 is increased in number of polar groups on the surface to 4 to 5 times the original number of about $1 \times 10^{16}/cm^2$, whereas it is increased in surface area to 7 to 20 times the original value. It is presumable that the number of polar groups found after etching is that of polar groups of the butadiene rubber remained on the phenolic resin microcapsules 7 having no polar group. Since the degree of increase in number of polar groups is smaller than that in surface area, contribution of the polar groups to the bond strength seems much less than that of the surface area.

Measurement of the number of polar groups was performed by the method of Methylene Blue dyeing and the method of palladium adsorption, as described in "Kogyokagaku Zasshi" (Journal of Applied Chemistry), Vol. 72, No. 9, pages 2055-2057, (1969), published from Chemical Society of Japan. Surface area was measured by the gas adsorption method and the method for testing surface roughness.

After etching, the surface of the adhesive layer 6 is contacted with an aqueous solution containing stannous chloride and palladium chloride to adsorb the substance catalytic to chemical plating. After washing, chemical plating is carried out. Copper, nickel, tin, gold, silver, cobalt, and rhodium compounds may be used as reducible metal compounds in chemical plating. For chemical plating of copper, an alkaline solution containing copper ion and a complexing agent may be used with formalin as reducing agent. For chemical plating of nickel, an alkaline or acidic solution may be used with a reducing agent of the hypophosphite type or the boron type.

For electroplating over a chemically deposited metal layer, a plating bath containing copper sulfate, copper pyrophosphate, copper borofluoride, or copper cyanide may be used.

The invention is illustrated below with reference to Examples.

EXAMPLE 1

One hundred parts by weight of an acrylonitrile-rich acrylonitrile-butadiene rubber (containing 41% of acrylonitrile) (e.g. Hycar 1001 type of B. F. Goodrich Chemical Co.) were masticated on a hot roll-mill at a temperature not exceeding 60° C. and dissolved in 150 parts by weight of methyl ethyl ketone to obtain a solution A.

One hundred parts by weight of a thermosettable resol type phenolic resin were dissolved in 100 parts by weight of methanol to obtain a solution B.

The solution B was slowly added to the solution A with vigorous stirring so as to ensure good dispersion of the phenolic resin contained in the solution B, to yield an adhesive composition. The viscosity of the resulting adhesive composition was adjusted with methyl ethyl ketone to 100 to 200 centipoises.

EXAMPLE 2

A phenol paper laminate was dipcoated on both sides with the adhesive composition prepared in Example 1 and heated at a temperature of 150° C. for 120 minutes. Immediately after the heating, the coated laminate was cooled in water so that the solvent in the adhesive layer may be completely removed and the adhesive may be hardened, thus forming phenolic resin microcapsules of a particle diameter of 0.1 to 2$\mu$.

The laminate coated with the adhesive was then immersed in an aqueous solution of an oxidizing agent having the following composition at 60° C. for 5 minutes to etch the surface of the adhesive layer.

Composition of the aqueous solution of oxidizing agent:

| | |
|---|---|
| Chromic anhydride | 400 g/liter, |
| Sulfuric acid (98%) | 250 cc/liter, |
| FC-178 (a fluorocarbon wetting agent manufactured by and sold from Minnesota Mining & Manufacturing Co., U.S.A.) | 0.2 g/liter. |

The thus treated laminate was then immersed in an aqueous solution containing 20 g/liter of stannous chloride and 80 cc/liter of 37-% hydrochloric acid for one minute, then washed with running water for 5 minutes, then immersed in an aqueous solution containing 1 g/liter of palladium chloride and 10 cc/liter of 37-% hydrochloric acid for one minute, and washed with running water for 5 minutes to obtain a treated laminate with adsorbed palladium metal which is catalytic to chemical plating.

The laminate with adsorbed palladium obtained above was subjected to chemical plating treatment at 65° C. for 10 hours by using a chemical copper-plating both of the following composition to deposit copper, 35$\mu$ in thickness.

Composition of chemical copper-plating bath:

| | |
|---|---|
| Copper sulfate | 20 g/liter, |
| Rochell salt | 50 g/liter, |
| Potassium carbonate | 30 g/liter, |
| Formalin | 10 cc/liter, |
| Sodium hydroxide to adjust pH to 12.5. | |

The printed circuits board thus obtained was tested for bond strength between the copper layer and the insulating substrate by separating the copper layer from the insulating substrate at a separation angle of 90° and at a separation rate of 50 mm/minute, the width of bond line being 10 mm. The bond strength (peel strength) was found to be 1.3 kg/cm. The soldering resistance was tested by floating a test specimen, 25 mm×25 mm, cut out of the above printed circuit board, on molten solder at 260° C. and measuring the time elapsed before disruption of either the insulating substrate or the copper layer was noticed. The time elapsed before disruption was found to be 20 to 30 seconds, meeting the practical requirement for a printed circuit board.

EXAMPLE 3

A phenol paper laminate was coated by dipping on both sides with the adhesive composition prepared in Example 1, then heated at 150° C. for 120 minutes, and immediately thereafter cooled in the air to remove completely the solvent contained in the adhesive layer and to set the latter.

The coated laminate was immersed in an aqueous solution of the following composition containing an oxidizing agent at 25° C. for 15 minutes to etch the surface of the adhesive layer.

Composition of the aqueous solution containing oxidizing agent:

| | |
|---|---|
| Potassium permanganate | 10 g/liter |
| Phosphoric acid | 300 cc/liter |
| Hydrogen peroxide | 100 cc/liter |
| FC-95 (a fluorocarbon wetting agent manufactured by and sold from Minnesota Mining & Manufacturing Co., U.S.A.) | 0.5 g/liter |

In the same manner as in Example 2, the thus treated laminate was subjected first to activation treatment to allow the adhesive surface to adsorb a substance catalytic to chemical deposition of metal and then subjected to chemical copper plating.

After chemical copper plating, the resulting printed circuit board showed a peel strength of 1.5 kg/cm between the copper layer and the insulating substrate and a soldering resistance of 30 to 40 seconds at 260° C.

EXAMPLE 4

A phenol paper laminate was coated by dipping on both sides with the adhesive composition prepared in Example 1 and then heated at 150° C. for 60 minutes under exposure to 100 kHz ultrasonic wave to remove completely the solvent contained in the adhesive layer and to set the latter.

In the same manner as in Example 3, etching of the adhesive surface, activation treatment for the adsorption of a substance catalytic to chemical plating, and chemical copper plating were carried out. On testing, the printed circuit board thus obtained showed a peel strength (between the copper layer and the insulating substrate) of 1.8 kg/cm and a soldering resistance of 30 to 40 seconds at 260° C.

EXAMPLE 5

A phenol paper laminate was coated by dipping on both sides with the adhesive composition prepared in Example 1 and then heated at 160° C. for 60 minutes under exposure to 50 kHz ultrasonic wave to set the adhesive layer.

Under the same conditions as in Example 3, etching of the adhesive layer and activation treatment for the adsorption of a substance catalytic to chemical plating were carried out. Then, chemical nickel plating was carried out at 85° C. for 10 minutes using a chemical plating bath of the following composition:

Composition of chemical nickel plating bath:

| | |
|---|---|
| Nickel chloride | 30 g/liter, |
| Sodium hypophosphite | 10 g/liter |

| | |
|---|---|
| Sodium citrate | 10 g/liter |

Thereafter, under the same conditions as in Example 2, electroless copper was deposited over the nickel layer to a thickness of 35μ. The printed circuit board thus obtained showed a peel strength (between the metal layer and the insulating substrate) of 2.5 kg/cm. It showed no failure after having been subjected to a solder dip test at 260° C. for 60 seconds.

The reason for the improvement of peel strength and soldering resistance by the application of nickel plating in this case seems to be that as compared with the case of copper, the deposited nickel layer is composed of particles in denser arrangement, giving rise to increased area of contact with phenolic resin microcapsules and, hence, increased adherence.

EXAMPLE 6

One hundred parts by weight of an acrylonitrile-rich acrylonitrile-butadiene rubber (containing 41% of acrylonitrile) (e.g. Hycar 1041 type of B. F. Goodrich Chemical Co.) were dissolved in 100 parts by weight of acetone to obtain a solution A. A solution B was obtained by dissolving 100 parts by weight of a thermosetting resol type phenolic resin in 100 parts by weight of methyl ethyl ketone. The solution B was slowly added to the solution A with vigorous stirring so as to ensure good dispersion of the phenolic resin contained in the solution B. The viscosity of the resulting dispersion was adjusted to 100 to 200 centipoises by adding methyl ethyl ketone to prepare an adhesive composition.

Figure 3:
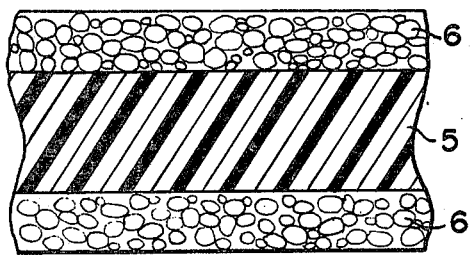
FIGS. 3 to 6 are cross-sectional views illustrating the steps in making a printed circuit board in one of the embodiments of this invention.

The above adhesive solution was applied to an epoxy-glass laminate 5 by means of a roll coater, as shown in FIG. 3, and heated at 160° C. under exposure to 100 kHz ultrasonic wave for 30 minutes to set the adhesive layer 6.

Figure 4:
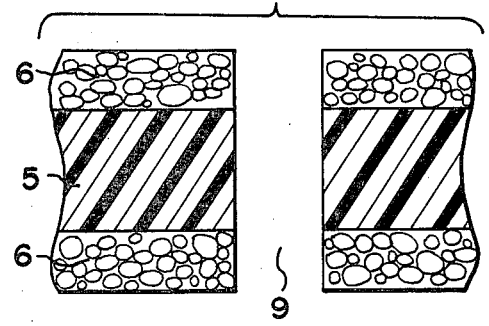
Figure 5:
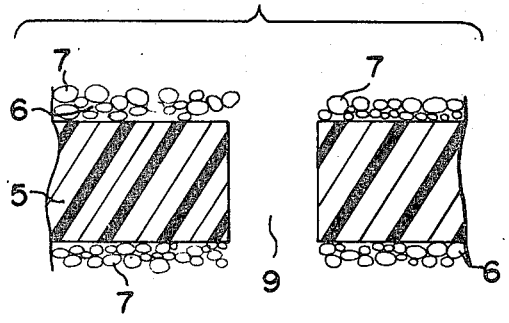

A printed circuit board was made in accordance with the following sequence of steps:

(1) As shown in FIG. 4, the above insulating substrate 5 with adhesive layers 6 was provided with a through hole 9 at the prescribed position by drilling;

(2) As shown in FIG. 5, the surfaces of the adhesive layers 6 were etched by immersion in an aqueous solution of the following composition containing an oxidizing agent at 60° C. for 15 minutes:

Composition of aqueous oxidizing solution:

| | |
|---|---|
| Potassium permanganate | 10 g/liter, |
| Potassium hydroxide to adjust pH to 12.5; | |

Figure 6:
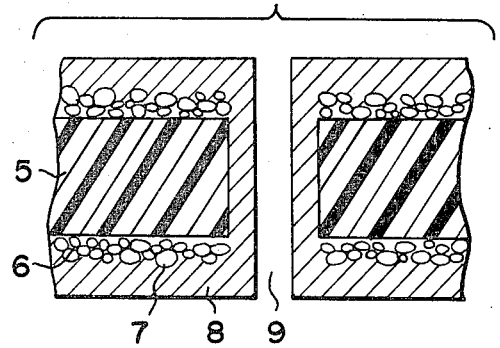

(3) Sensitizing treatment for the adsorption of a substance catalytic to chemical plating on the etched surfaces and the wall of through hole;

(4) Chemical plating to deposit nickel in thin layers as carried out under the same conditions as in Example 5;

(5) Application of plating resist (Riston T-14 of E. I. Du Pont de Nemours & Co. Inc.) by photographic method to the areas in negative pattern;

(6) Electro copper plating by use of a plating bath of the following composition and under the following conditions to electrodeposit copper 8 on the pattern areas and the wall of through hole, as shown in FIG. 6:

Composition of electrolytic copper plating bath:

| | |
|---|---|
| Copper pyrophosphate | 90 g/liter, |
| Potassium pyrophosphate | 200 g/liter, |
| Aqueous ammonia | 4 cc/liter; |

Plating conditions:

| | |
|---|---|
| pH | 8.6 |
| Temperature | 50°-60° C. |
| Current density | 3A/dm$^2$ |
| Time | 60 minutes; |

(7) Removal of the resist with methylene chloride;

(8) Quick etching by treating with a 250 g/liter solution of ammonium persulfate at 40° C. for 5 minutes to dissolve and remove the exposed nickel layer in the negative pattern areas.

The printed circuit board thus obtained had a peel strength of 2.8 kg/cm. It showed no failure after having been subjected to a solder dip test at 260° C. for 60 seconds.

A pattern was formed on the board so that conductor strips, 0.5 mm width by 100 mm length, are arranged parallel to one another and 0.3 mm apart. The board was left standing for 1,000 hours under application of 100 V DC in a constant temperature and constant humidity cabinet at 55° C., 90% RH, without showing any failure.

A test board having 1,000 through holes, each 2.54 mm apart, was prepared. After having been plated, each hole had a diameter of 1.0 mm. Each hole was provided with a land, 2 mm in diameter, and the adjacent pads were connected with one another through conductors, 1 mm in width. The board was subjected to the following temperature cycle test and thermal shock test and showed no failure in electrical continuity. Temperature cycle test was repeated 100 times (100 cycles), one cycle consisting of keeping for 30 minutes at −65° C., 5 minutes at 25° C., 30 minutes at 125° C., and 5 minutes at 25° C. in sequence. Thermal shock test was repeated 5 times (5 cycles), one cycle consisting of immersion in a silicone oil at 260° C. for 10 seconds followed by immersion in trichloroethylene at 25° C. for 10 seconds. Evaluation of the test results was based on the change in percent of the through hole resistance. If the change exceeded 10%, it was evaluated as connection failure. These tests were found helpful for improving precision of the formed pattern.

EXAMPLE 7

An adhesive composition prepared in the same manner as in Example 6 was coated on a phenol paper laminate and treated to set. A printed circuit board was formed by the procedure involving the following sequence of steps:

(1) Providing the adhesive-coated insulating substrate with a punched through hole;

(2) Etching the surface of the adhesive coating with an oxidizing agent under the same conditions as in step (1) of Example 6, and subsequent drying at 100° C. for 10 minutes;

(3) Applying an alkali-soluble resist (Alkali removale resist #227 of NAZ-DAR Company International) in a negative-image pattern by screen printing and drying at 90° C. for 5 minutes;

(4) After degreasing and washing with water, immersing in Catalyst 9F (a palladium catalyst manufactured by Shipley Co., Inc.) at room temperature for 5 minutes; washing with water; immersing in a 5% aqueous solution of sodium hydroxide to remove completely the resist;

(5) Subjecting to activation treatment for the adsorption of a substance catalytic to the chemical plating; then applying chemical nickel plating to deposit nickel in thin layers over pattern areas and the wall of the through hole; and (6) Applying chemical copper plating to the nickel layers to deposit copper, 35$\mu$ in thickness.

All of the tests for peel strength, soldering resistance, electrolytic corrosion, and through hole reliability conducted on the above printed circuit board showed satisfactory results as follows:

| Peel strength: | 2.0 kg/cm |
|---|---|
| Soldering resistance: | No blister at 60 sec. |
| Insulation resistance test: | No failure |
| Continuity test: | No failure |

The above simplified procedure proved to be suitable for the large-scale production.

EXAMPLE 8

An adhesive composition prepared in the same manner as in Example 6 was coated on a phenol paper laminate and treated to set. A printed circuit board was formed by the procedure comprising the following sequence of steps:

(1) Providing the adhesive-coated insulating substrate with a punched through hole;

(2) Applying a chemical-resistant and hydrophobic resist (a liquid composition of thermosetting phenolic or epoxy resin admixed with a silicone oil) having the following formulation in a negative-image pattern;

| Epoxy resin ink S-22 (Taiyo Ink Manufacturing Co., Ltd.): | 100 parts by weight |
|---|---|
| Silicon oil KR-3093 (Shin-etsu Chemical Industry Co., Ltd.): | 2 parts by weight |
| Printing method: | Screen printing |
| Curing condition: | At 145° C. for 10 minutes. |

(3) Etching the surfaces with an oxidizing agent under the same conditions as in the step 2 of Example 6;

(4) Subjecting to activation treatment carried out under the same conditions as in Example 7 to allow the etched surfaces of the coated substrate to adsorb a substance catalytic to chemical plating;

(5) Subjecting to chemical nickel plating under the same conditions as in Example 5 to deposit thin layers of nickel on pattern areas and the wall of the through hole; and (6) Subjecting to chemical copper plating under the same conditions as in Example 2 to deposit copper to a thickness of 35$\mu$.

All of the tests for peel strength, soldering resistance, electrolytic corrosion, and through holes reliability performed on the printed circuit board thus obtained showed satisfactory results as follows:

| Peel strength: | 2.0 kg/cm |
|---|---|
| Soldering resistance: | No blister at 60 sec. |
| Continuity test: | No failure |
| Insulation resistance test: | No failure |

The above procedure was found to be suitable for automated production.

EXAMPLE 9

An adhesive composition prepared in the same manner as in Example 6 was coated on a phenol paper laminate and treated to set. A printed circuit was formed by the procedure comprising the following sequence of steps:

(1) Providing the adhesive-coated insulating substrate a punched through hole;

(2) Etching the adhesive surfaces with an oxidizing agent under the same conditions as in Example 2;

(3) Coating the adhesive surfaces and the wall of the through hole by dipping with the following solution, then drying at 70° C. for 5 minutes;

| Copper acetate | 8 g/liter |
|---|---|
| Pentaerythritol | 50 g/liter |
| Sorbitol | 60 g/liter |
| Citric acid | 40 g/liter |
| Disodium anthraquinone-2,6-disulfonate | 16 g/liter |
| Stannous chloride | 0.8 g/liter |
| Surfactant 6G (Nonionic surfactant prepared by reacting nonyl phenol with glicydol) (Rohm & Haas Co.,) | 1.5 g/liter |

(4) Exposing the prescribed pattern areas and the wall of the through hole to ultraviolet rays to reduce the copper ion, thus metallizing the exposed areas; and (5) Depositing copper to a thickness of 35$\mu$ by chemical copper plating under the same conditions as in Example 2.

All of the tests for peel strength, soldering resistance, electrolytic corrosion, and through hole reliability conducted on the above printed circuit board gave satisfactory results as follows:

| Peel strength: | 1.2 kg/cm |
|---|---|
| Soldering resistance: | 30 sec. |
| Continuity test: | No failure |
| Insulating resistance test: | No failure |

EXAMPLE 10

A phenol paper laminate was provided with a punched through hole. The adhesive composition prepared in Example 1 was coated on the surfaces and the wall of the through hole of the above insulating substrate, and then treated to set. The coated substrate was subjected to the treatments (2) to (6) of Example 7 to obtain a printed circuit board.

The above printed circuit board was applied with a solder by the flow-soldering technique. Less blowholes were formed compared with a printed circuit board with a through hole not coated with an adhesive. The latter printed circuit board showed a blowhole percent of 15, while that of the present printed circuit board showed that of 5. The reason for this seems to be that the adhesive coating applied on the wall of through hole protects the board from absorption of water during various treatments and also acts as a protective screen against gases generated in soldering.

EXAMPLE 11

A phenol paper laminate was coated by dipping on both sides with the adhesive composition prepared in Example 1 and exposed to ultraviolet rays for 30 minutes so that the temperature of the coated laminate may be maintained at 150° C. to remove completely the solvent in the adhesive coating and to set the adhesive. The resulting coated laminate was subjected, under the same conditions as in Example 3, to etching, activating, and chemical copper plating to obtain a printed circuit board. The printed circuit board showed a peel strength (between the copper layer and the substrate) of 1.8 kg/cm and a soldering resistance of 30 to 40 seconds at 260° C.

As is apparent from the above Examples, the present invention provides a printed circuit board which has a high peel strength and excellent soldering resistance and, in addition, resists against electrolytic corrosion, because phenolic resin microcapsules are utilized to improve adherence of the metal layer to the insulating substrate.

Further, the present printed circuit board can be provided with highly reliable through holes, because even if a dimensional change occurs along the Z-axis of the insulating board due to temperature change, buffer action of the acrylonitrile-butadiene rubber matrix of the adhesive coating on the wall of through hole protects the through hole from connection failure.

Moreover, as described in the foregoing, the present invention provides also an industrially valuable method for easily making a reliable printed circuit board which is excellent in peel strength, soldering resistance, electrolytic corrosion resistance, and through hole reliability.

What is claimed is:

1. A printed circuit board made by applying onto an insulating substrate an adhesive coating consisting essentially of 20 to 100 parts by weight of an acrylonitrile-rich acrylonitrile-buradiene rubber and 50 to 100 parts by weight of a thermosettable resol type phenolic resin finely dispersed therein, setting the adhesive coating to form microcapsules having phenolic resin shells, etching the surface of the adhesive coating with an oxidizing agent to expose the microcapsules having phenolic resin shells which have been formed during the setting of said adhesive coating, subjecting the thus treated surface of the adhesive coating to a sensitizing treatment to allow the surface to adsorb a substance having catalytic effect on chemical metal plating, and thereafter forming on said adhesive coating a chemically deposited metal layer which adheres to said microcapsules.

2. A printed circuit board according to claim 1, wherein the chemically deposited metal layer adhering to said microcapsules is a chemically deposited nickel layer.

3. A method for making a printed circuit board, which comprises applying onto an insulating substrate an adhesive coating consisting essentially of 20 to 200 parts by weight of an acrylonitrile-rich acrylonitrile-butadiene rubber and 50 to 100 parts by weight of a thermosettable resol type phenolic resin finely dispersed therein, allowing the adhesive coating to set, whereby microcapsules having phenolic resin shells are formed in the adhesive coating, etching the surface of said adhesive coating with an oxidizing agent which is an acidic or alkaline aqueous solution of potassium permanganate thereby to expose said microcapsules, subjecting the thus treated surface of the adhesive coating to sensitizing treatment to allow the surface to adsorb a substance having catalytic effect on chemical metal plating, and thereafter forming on said adhesive coating a chemically deposited metal layer which adheres to said microcapsules.

4. A method for making a printed circuit board according to claim 3, wherein the chemically deposited metal layer adhering to the microcapsules is nickel.

* * * * *